(12) United States Patent
Liao et al.

(10) Patent No.: US 11,342,021 B2
(45) Date of Patent: May 24, 2022

(54) MIXED MODE MEMORY

(71) Applicants: JIANGSU ADVANCED MEMORY TECHNOLOGY CO., LTD., Huaian (CN); JIANGSU ADVANCED MEMORY SEMICONDUCTOR CO., LTD., Huaian (CN); ALTO MEMORY TECHNOLOGY CORPORATION, Zhubei (TW)

(72) Inventors: Yu-Cheng Liao, Zhubei (TW); Chun-Chih Liu, Zhubei (TW); Ching-Sung Chiu, Zhubei (TW)

(73) Assignees: JIANGSU ADVANCED MEMORY TECHNOLOGY CO., LTD., Huaian (CN); JIANGSU ADVANCED MEMORY SEMICONDUCTOR CO., LTD., Huaian (CN); ALTO MEMORY TECHNOLOGY CORPORATION, Zhubei (TW)

( * ) Notice: Subject to any disclaimer, the term of this patent is extended or adjusted under 35 U.S.C. 154(b) by 71 days.

(21) Appl. No.: 16/885,132

(22) Filed: May 27, 2020

(65) Prior Publication Data
US 2021/0280249 A1 Sep. 9, 2021

(30) Foreign Application Priority Data
Mar. 3, 2020 (CN) .......................... 202010139335.7

(51) Int. Cl.
G11C 11/00 (2006.01)
G11C 14/00 (2006.01)
(Continued)

(52) U.S. Cl.
CPC .......... *G11C 14/009* (2013.01); *G11C 11/412* (2013.01); *G11C 11/419* (2013.01);
(Continued)

(58) Field of Classification Search
CPC . G11C 11/5628; G11C 16/0483; G11C 16/10; G11C 2211/5641; G11C 11/5642;
(Continued)

(56) References Cited

U.S. PATENT DOCUMENTS

9,318,196 B1* 4/2016 Kasai ................. G11C 14/0063
11,049,563 B1* 6/2021 Liao ..................... G11C 14/009
(Continued)

*Primary Examiner* — Hien N Nguyen
(74) *Attorney, Agent, or Firm* — Maschoff Brennan (57) ABSTRACT

A mixed mode memory comprises a memory array, a word line decoder, an intermediary circuit and a reading and writing circuit, wherein the word line decoder is electrically coupled to the memory array, and the intermediary circuit is electrically coupled to the memory array and the writing circuit. The memory array comprises mixed mode memory cells with each cell comprising a reading and writing component group, a storage circuit and a selection circuit. The reading and writing component group is electrically coupled to a word line which controls the reading and writing component group to be conducted or not conducted, and electrically coupled to two bit lines which respectively transmit two data signals. The storage circuit generates two reading response signals based on a reading drive signal. The selection circuit controls the storage circuit to operate in a volatile or non-volatile storage mode based on a selection voltage.

10 Claims, 7 Drawing Sheets

(51) Int. Cl.
*G11C 13/00* (2006.01)
*G11C 11/419* (2006.01)
*G11C 11/412* (2006.01)

(52) U.S. Cl.
CPC ........ *G11C 13/004* (2013.01); *G11C 13/0004* (2013.01); *G11C 13/0028* (2013.01); *G11C 13/0069* (2013.01)

(58) Field of Classification Search
CPC ....... G11C 16/26; G11C 11/419; G11C 16/08; G11C 11/4074
See application file for complete search history.

(56) References Cited

U.S. PATENT DOCUMENTS

| | | | |
|---|---|---|---|
| 2007/0041242 A1* | 2/2007 | Okazaki ............. | G11C 13/0061 365/154 |
| 2010/0202191 A1* | 8/2010 | Ahn .................... | G11C 14/0081 365/154 |
| 2011/0280073 A1* | 11/2011 | Chiu .................. | G11C 13/0002 365/185.08 |
| 2012/0320658 A1* | 12/2012 | Wang ................. | G11C 14/0054 365/148 |
| 2013/0135921 A1* | 5/2013 | Owada ................ | G11C 14/009 365/148 |

* cited by examiner

MIXED MODE MEMORY

CROSS-REFERENCE TO RELATED APPLICATIONS

This non-provisional application claims priority under 35 U.S.C. § 119(a) on Patent Application No(s). 202010139335.7 filed in China on Mar. 3, 2020, the entire contents of which are hereby incorporated by reference.

BACKGROUND

1. Technical Field

This disclosure relates to a memory, and particularly to a mixed mode memory.

2. Related Art

Static random access memories (SRAM) is a kind of random access memories wherein the term "static" means that as long as the power is kept on, the stored data can be constantly maintained. In contrast, the data stored in dynamic random access memories (DRAM) is updated periodically. In comparison with DRAM, SRAM has advantages of high speed, low power consumption, etc. However, in case the power supply is turned off, the data stored in either SRAM or DRAM will disappear, so SRAM and DRAM are called volatile memories.

SUMMARY

Accordingly, this invention provides a mixed mode memory.

According to an embodiment of this invention, a mixed mode memory comprises a memory array, a word line decoder, an intermediary circuit and a reading and writing circuit, wherein the word line decoder is electrically coupled to the memory array, the intermediary circuit is electrically coupled to the memory array, and the reading and writing circuit is electrically coupled to the intermediary circuit. The memory array comprises a plurality of mixed mode memory cells with each cell comprising a reading and writing component group, a storage circuit and a selection circuit. The reading and writing component group is electrically coupled to a word line and two bit lines, wherein the word line controls the reading and writing component group to be conducted or not conducted, and the two bit lines respectively transmit two data signals. The storage circuit is configured to generate two reading response signal based on a reading drive signal. The selection circuit electrically coupled to the storage circuit, and configured to control the storage circuit to operate in a volatile storage mode or a non-volatile storage mode based on a selection voltage.

In view of the above, the mixed mode memory provided in this invention comprises an array composed of a number of mixed mode memory cells each of which can be set to operate in a volatile storage mode or a non-volatile storage mode according to requirements, so the mixed mode memory, thus having high adaptability. By adjusting the selection voltage corresponding to each memory cell in the memory, the mixed mode memory provided in this invention may match a variety of computing devices or other electronic devices with different requirements for a specific storage mode without changing the circuit design of the memory; therefore, the development cost is reduced.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
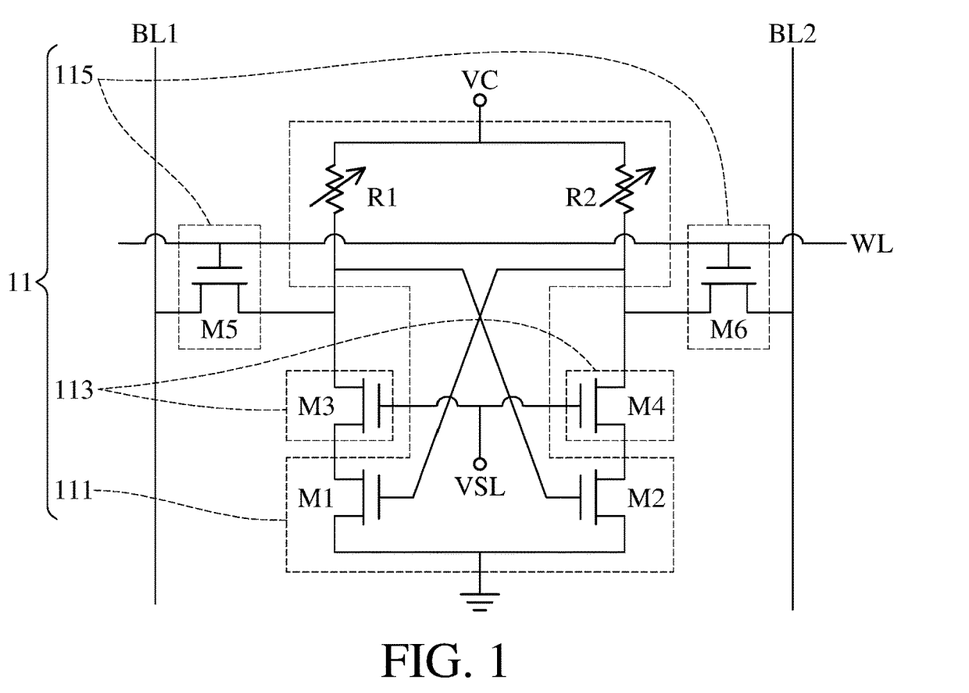
FIG. 1 is a schematic circuit diagram of a mixed mode memory cell according to an embodiment of this invention.

This invention provides a mixed mode memory cell that can operate in multiple storage modes including a volatile storage mode and a non-volatile storage mode. Please refer to FIG. 1 and FIG. 2, wherein FIG. 1 is a schematic circuit diagram of a mixed mode memory cell 11 according to an embodiment of this invention, and FIG. 2 exemplarily illustrates the electrical coupling terminals of the mixed mode memory cell 11.

Figure 2:
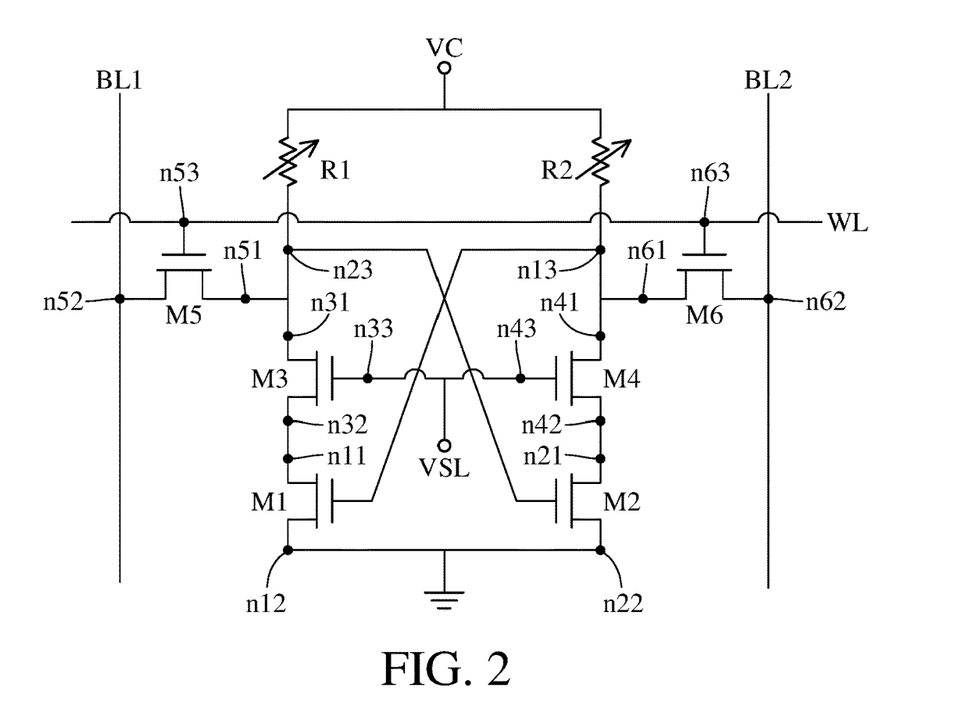
FIG. 2 is a schematic diagram showing electrical coupling terminals of a mixed mode memory cell according to an embodiment of this invention.

The mixed mode memory cell 11 comprises a storage circuit 111, a selection circuit 113 and a reading and writing component group 115. The storage circuit 111 can operate in the volatile storage mode or the non-volatile storage mode based on the electrical coupling status among the internal elements. In other words, the storage circuit 111 can temporarily or permanently store data based on the electrical coupling status among the internal elements. The components of the internal elements and the coupling relationship among the internal elements will be described later. In the volatile storage mode, when the electric power supplied to the mixed mode memory cell 11 is turned off, the data stored in storage circuit 111 will disappear; in contrast, in the non-volatile storage mode, when the electric power supplied to the mixed mode memory cell 11 is turned off, the data stored in the storage circuit 111 won't disappear. The selection circuit 113 is electrically coupled to the storage circuit 111, and configured to control the aforementioned electrical coupling status among the internal elements of the storage circuit 111 based on a selection voltage VSL so as to control the storage circuit 111 to operate in the volatile storage mode or the non-volatile storage mode. The reading and writing component group 115 is electrically coupled to the storage circuit 111 and the selection circuit 113, and configured to be controlled by a word line WL to transmit two data signals (hereinafter referred to as "writing signals") from two bit lines (hereinafter referred to as "first bit line BL1" and "second bit line BL2") to the storage circuit 111, so that the storage circuit 111 can store the writing signals from the first and second bit lines BL1 and BL2 under the volatile storage mode or the non-volatile storage mode which is determined by the selection circuit 113 as mentioned above.

The elements included in each circuit are further described in the following. As shown in FIG. 1, the storage circuit 111 comprises two variable resistors (hereinafter referred to as "first variable resistor R1" and "second variable resistor R2") and two transistors (hereinafter referred to as "first transistor M1" and "second transistor M2"), wherein the first and second variable resistors R1 and R2 serve as pull-up elements and the first and second transistors M1 and M2 serve as pull-down elements. More particularly, the first and second variable resistors R1 and R2 can each comprise a phase change element or a resistance change element. As an example, the phase change element can consist of a phase change material (PCM) and a conductive material such as metal, wherein the two materials are located close to each other, such that when a high current passes through the conductive material, the conductive material will heat the phase change material, and the phase of the phase change material is accordingly adjusted. The resistance of the phase change material in an amorphous state is higher than the resistance of the phase change material in a crystalline state. The resistance change element can be, for example, an element that generally consists of a resistive random access memory (RRAM). Each of the first and second transistors M1 and M2 can be a metal-oxide-semiconductor field-effect transistor (MOSFET), and particularly be an N-type metal-oxide-semiconductor field-effect transistor (NMOSFET).

The selection circuit 113 comprises a third transistor M3 and a fourth transistor M4, wherein the third and fourth transistors M3 and M4 can be metal-oxide-semiconductor field-effect transistors (MOSFET), and not limited to N-type or P-type MOSFET in this invention. As mentioned above, the selection circuit 113 can control the electrical coupling status among the internal elements of the storage circuit 111 based on the selection voltage VSL. More particularly, the selection circuit 113 can control the electrical coupling status between the first and second variable resistors R1 and R2 and the first and second transistors M1 and M2 of the storage circuit 111 to be conducted or not conducted based on the selection voltage VSL. The reading and writing component group 115 comprises a fifth transistor M5 and a sixth transistor M6 which are controlled by the word line WL to respectively transmit the writing signals from the first and second bit lines BL1 and BL2. The fifth and sixth transistors M5 and M6 can be metal-oxide-semiconductor field-effect transistors (MOSFET), and particularly be N-type MOSFET.

As shown in FIG. 1 and FIG. 2, each resistor has two terminals, and each transistor has three terminals. For ease of explanation, in FIG. 2, the three terminals of the first transistor M1 are illustrated as the first terminal n11, the second terminal n12 and the control terminal n13; the three terminals of the second transistor M2 are illustrated as the first terminal n21, the second terminal n22 and the control terminal n23; the three terminals of the third transistor M3 are illustrated as the first terminal n31, the second terminal n32 and the control terminal n33; the three terminals of the fourth transistor M4 are illustrated as the first terminal n41, the second terminal n42 and the control terminal n43; the three terminals of the fifth transistor M5 are illustrated as the first terminal n51, the second terminal n52 and the control terminal n53; and the three terminals of the sixth transistor M6 are illustrated as the first terminal n61, the second terminal n62 and the control terminal n63.

The following further describes the electrical coupling relationship among the internal elements of the storage circuit 111 based on FIG. 2. As shown in FIG. 2, one terminal of the first variable resistor R1 of the storage circuit 111 is configured to receive a control voltage VC and the other terminal of the first variable resistor R1 is electrically coupled to the control terminal n23 of the second transistor M2; one terminal of the second variable resistor R2 is configured to receive the control voltage VC and the other terminal of the second variable resistor R2 is electrically coupled to the control terminal n13 of the first transistor M1. The first variable resistor R1 and the second variable resistor R2 can be respectively and electrically coupled to two voltage sources which separately supply the control voltage VC, or be electrically coupled to a same voltage source which independently supplies the control voltage VC, where it is understood that the coupling configurations of these elements are not limited in this invention. Moreover, the second terminals n12 and n22 of the first and second transistors M1 and M2 are grounded.

The following further describes the electrical coupling relationship between the storage circuit 111 and the selection circuit 113. The first terminal n31 of the third transistor M3 of the selection circuit 113 is electrically coupled to one terminal of the first variable resistor R1 of the storage circuit 111 and the control terminal n23 of the second transistor M2; the second terminal n32 of the third transistor M3 of the selection circuit 113 is coupled to the first terminal n11 of the first transistor M1 of the storage circuit 111; the control terminal n33 of the third transistor M3 of the selection circuit 113 is configured to receive the selection voltage VSL. The coupling relationship between the fourth transistor M4 of the selection circuit 113 and the storage circuit 111 is symmetrical to the coupling relationship between the third transistor M3 of the selection circuit 113 and the storage circuit 111. The first terminal n41 of the fourth transistor M4 of the selection circuit 113 is electrically coupled to one terminal of the second variable resistor R2 of the storage circuit 111 and the control terminal n13 of the first transistor M1; the second terminal n42 of the fourth transistor M4 of the selection circuit 113 is coupled to the first terminal n21 of the second transistor M2 of the storage circuit 111; the control terminal n43 of the fourth transistor M4 of the selection circuit 113 is also configured to receive the selection voltage VSL. The control terminal n33 of the third transistor M3 and the control terminal n43 of the fourth transistor M4 can be respectively and electrically coupled to two voltage sources which separately supply the selection voltage VSL, or be electrically coupled to a same voltage source which independently supplies the selection voltage VSL, where it is understood that the coupling configurations of these elements are not limited in this invention. Said one or two voltage sources can be driven based on the selection of a user, or the mixed mode memory cell 11 can further comprise a microprocessor or a microcontroller to drive said one or two voltage sources to supply the selection voltage VSL based on a preset selection.

With the above coupling relationship, the storage circuit 111 can operate in the volatile storage mode or the non-volatile storage mode based on the selection voltage VSL. When the selection voltage VSL is supplied to make the third and fourth transistors M3 and M4 be conducted, the electrical coupling status between the first and second variable resistors R1 and R2 and the first and second transistors M1 and M2 is conducted so the storage circuit 111 operates in the volatile storage mode; when the selection voltage VSL is supplied to make the third and fourth transistors M3 and M4 not to be conducted, the electrical coupling status between the first and second variable resistors R1 and R2 and the first and second transistors M1 and M2 is not conducted so the storage circuit 111 operates in the non-volatile storage mode. The voltage value of the selection voltage VSL used for conducting or not conducting the third and fourth transistors M3 and M4 can be designed by a person having ordinary skill in the art based on the types of the third and fourth transistors M3 and M4, and is not described in detail herein.

The following further describes the electrical coupling relationship between the reading and writing component group 115 and other circuits. As shown in FIG. 2, the first terminal n51 of the fifth transistor M5 of the reading and writing component group 115 is electrically coupled to the first terminal n31 of the third transistor M3 of the selection circuit 113; that is, the first terminal n51 of the fifth transistor M5 is also electrically coupled to the first variable resistor R1 of the storage circuit 111. The second terminal n52 of the fifth transistor M5 is configured to be electrically coupled to the first bit line BL1, and the control terminal n53 of the fifth transistor M5 is configured to be electrically coupled to the word line WL. Symmetrically, the first terminal n61 of the sixth transistor M6 of the reading and writing component group 115 is electrically coupled to the first terminal n41 of the fourth transistor M4 of the selection circuit 113; that is, the first terminal n61 of the sixth transistor M6 is also electrically coupled to the second variable resistor R2 of the storage circuit 111. The second terminal n62 of the sixth transistor M6 is configured to be electrically coupled to the second bit line BL2, and the control terminal n63 of the sixth transistor M6 is configured to be electrically coupled to the word line WL. When the voltage supplied by the word line WL makes the fifth and sixth transistors M5 and M6 be conducted, the fifth transistor M5 can transmit the writing signal from the first bit line BL1 and the sixth transistor M6 can transmit the writing signal from the second bit line BL2. The voltage value used for conducting the fifth and sixth transistors M5 and M6 can be designed by a person having ordinary skill in the art based on the types of the fifth and sixth transistors M5 and M6, and is not described in detail herein.

Figure 3:
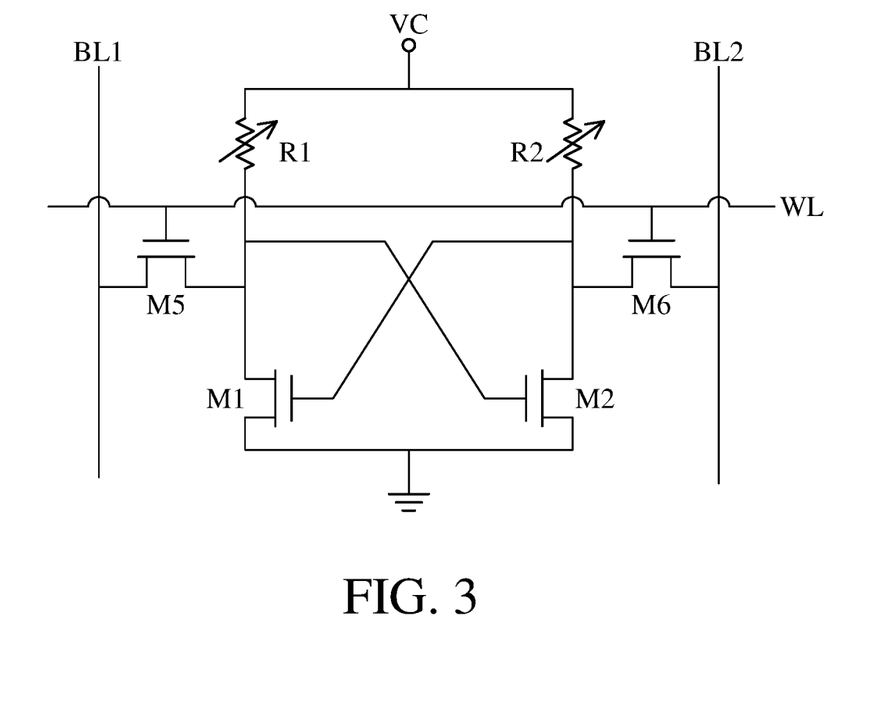
FIG. 3 is an equivalent circuit diagram of a mixed mode memory cell in the volatile storage mode according to an embodiment of this invention.
Figure 4:
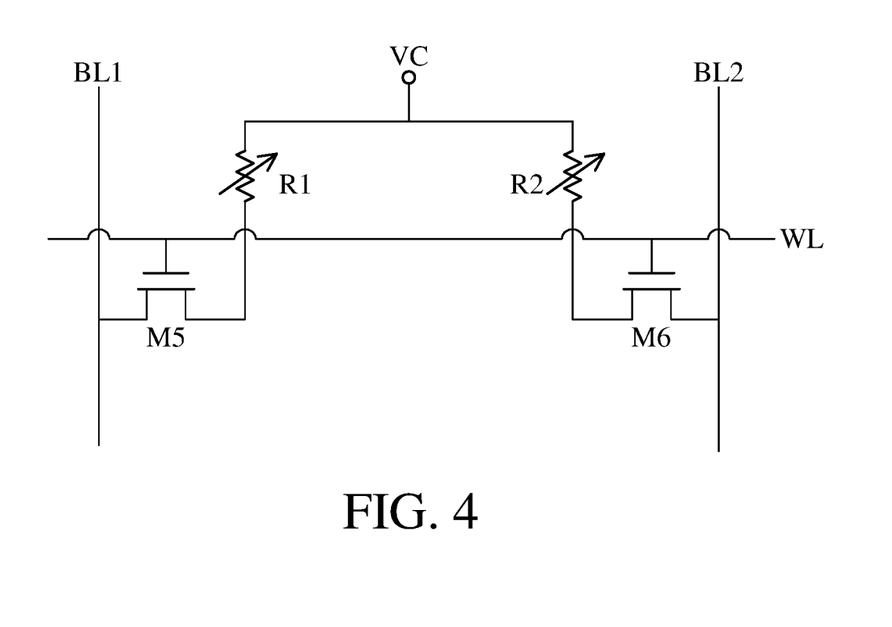
FIG. 4 is an equivalent circuit diagram of a mixed mode memory cell in the non-volatile storage mode according to an embodiment of this invention.

The elements to which the aforementioned fifth and sixth transistors M5 and M6 transmit the writing signals are determined based on the selection voltage VSL, and particularly are dependent on whether the third and fourth transistors M3 and M4 are conducted or not. Please refer to FIG. 1, FIG. 3 and FIG. 4, wherein FIG. 3 is an equivalent circuit diagram of the mixed mode memory cell 11 in the volatile storage mode according to an embodiment of this invention and FIG. 4 is an equivalent circuit diagram of the mixed mode memory cell 11 in the non-volatile storage mode according to an embodiment of this invention. In the implementation of the volatile storage mode shown in FIG. 3, the third and fourth transistors M3 and M4 of the selection circuit 113 are conducted based on the selection voltage VSL, so the electrical coupling status between the first and second variable resistors R1 and R2 and the first and second transistors M1 and M2 is in a status where they are electrically coupled with each other via wires. The equivalent circuit shown in FIG. 3 is similar to the circuit of static random access memory (SRAM), which is a volatile memory. In this implementation, the read and write operations of the mixed mode memory cell 11 are similar to those of SRAM, and are not described in detail herein.

In the implementation of the non-volatile storage mode shown in FIG. 4, the third and fourth transistors M3 and M4 are not conducted based on the selection voltage VSL, resulting in that the first and second transistors M1 and M2 are also not conducted. In this implementation, the mixed mode memory cell 11 can use the first and second variable resistors R1 and R2 together to store one bit, or use the first and second variable resistors R1 and R2 to respectively store two bits. More particularly, in the case of being used together for storing one bit, the first and second bit lines BL1 and BL2 can respectively be a complementary bit line (BLB) and a bit line (BL), and the writing signals they transmitted are a set of complementary signals, including a resetting signal and a setting signal. As mentioned above, the first and second variable resistors R1 and R2 can each comprise a phase change element, which can be in the amorphous state to have a high resistance or in the crystalline state to have a low resistance based on the voltage or current waveforms they carry. For example, the resetting signal can be a voltage or current waveform with a high amplitude and a short duration, and this kind of voltage or current waveforms leads the phase change material to be at the amorphous state and makes the corresponding resistor has a relatively high resistance; on the other hand, the setting signal can be a voltage or current waveform with a lower amplitude and a longer duration when compared to the resetting signal, and this kind of voltage or current waveforms leads the phase change material to be at the crystalline state and makes the corresponding resistor has a relatively low resistance.

In this case, it can be assumed that the condition in which first variable resistor R1 has a relatively low resistance and the second variable resistor R2 has a relatively high resistance indicates bit 0, and the opposite condition indicates bit 1. Accordingly, if it is intended that bit 0 is written into the storage circuit 111, a setting signal is transmitted to the first variable resistor R1 through the first bit line BL1 and a resetting signal is transmitted to the second variable resistor R2 through the second bit line BL2; if it is intended that bit 1 is written into the storage circuit 111, a resetting signal is transmitted to the first variable resistor R1 through the first bit line BL1 and a setting signal is transmitted to the second variable resistor R2 through the second bit line BL2. During the reading phase, a reading drive signal such as a constant voltage is applied to the first and second bit lines BL1 and BL2 and the current values of the two lines are measured, and the bit stored in the first and second variable resistors R1 and R2 is determined according to the relative values between the resistances of the first and second variable resistors R1 and R2 which is determined by comparing the current values of the two lines; or, a constant current can serve as the reading drive signal and be applied to the first and second bit lines BL1 and BL2, and the voltage values of the two lines are measured, and then the bit stored in the first and second variable resistors R1 and R2 is determined according to the relative values between the resistances of the first and second variable resistors R1 and R2 which is determined by comparing the voltage values of the two lines.

In the case that the first and second variable resistors R1 and R2 are used to store two bits respectively, the first variable resistor R1 and second variable resistor R2 are two independent storage elements. In this case, it can be assumed that the variable resistor has a relatively low resistance as it stores bit 0, and has a relatively high resistance as it stores bit 1. Transmitting a setting signal to the first variable resistor R1 through the first bit line BL1 can lead the first variable resistor R1 to store bit 0, and transmitting a resetting signal to the first variable resistor R1 through the first bit line BL1 can lead the first variable resistor R1 to store bit 1. The writing operation for the second variable resistor R2 is operated in the same way. During the reading phase, a constant voltage is applied to the first and second bit lines BL1 and BL2 and the current values of the two lines are measured, and each of the first and second variable resistors R1 and R2 is determined to store bit 0 or 1 by comparing its current value with a reference current value; or, a constant current is applied to the first and second bit lines BL1 and BL2 and the voltage values of the two lines are measured, and each of the first and second variable resistors R1 and R2 is determined to store bit 0 or 1 by comparing its voltage value with a reference voltage value.

By the above-mentioned method of using the voltage or current waveforms to program the resistances of the first and second variable resistors R1 and R2, even if the power supply is turned off, the first and second variable resistors R1 and R2 can maintain the state before the power supply is turned off, so that the two resistors can be non-volatile storage elements. In particular, the first and second bit lines BL1 and BL2 can be controlled by a read and write control circuit (not shown). The read and write control circuit can perform the aforementioned operations of providing a writing signal or providing a reading signal, and can also proceed with determination of the stored bit.

Figure 5:
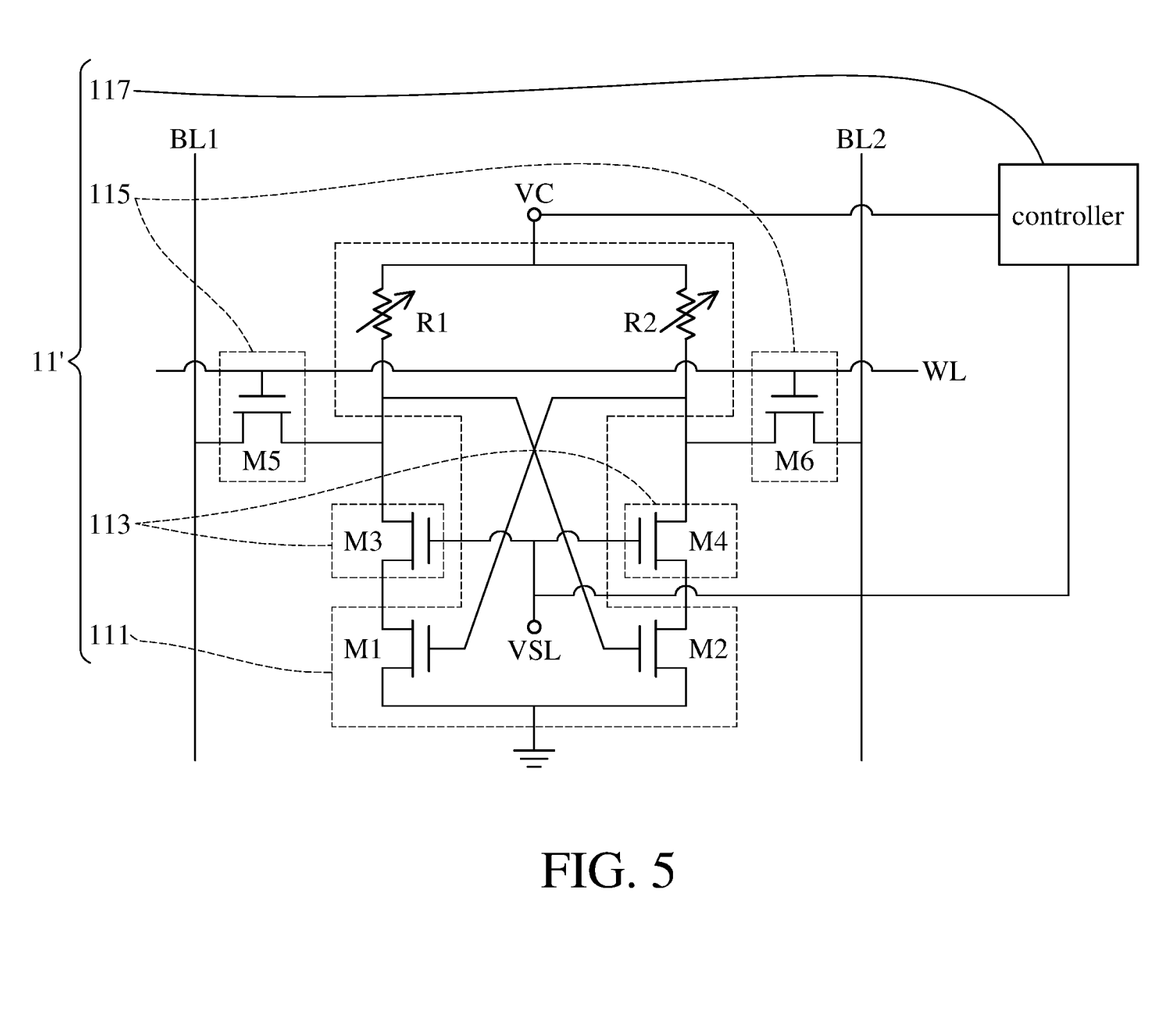
FIG. 5 is a schematic circuit diagram of a mixed mode memory cell according to another embodiment of this invention.

This invention also provides a mixed mode memory cell that comprises a controller in addition to the circuit structure as described in the above embodiments. Please refer to FIG. 1 and FIG. 5, wherein FIG. 5 is a schematic circuit diagram of a mixed mode memory cell 11' according to another embodiment of this invention. As shown in FIG. 1 and FIG. 5, the elements of the mixed mode memory cell 11' and their electrical coupling relationship are the same as the elements of the mixed mode memory cell 11 and their electrical coupling relationship, so the circuits formed by the elements of the mixed mode memory cell 11' and the operations of the circuits are not repeated. In addition to the electronic elements of the mixed mode memory cell 11, the mixed mode memory cell 11' further comprises a controller 117. The controller 117 is electrically coupled to the storage circuit 111 and the selection circuit 113, and configured to detect the selection voltage VSL and to selectively modulate the voltage value of the control voltage VC based on the selection voltage VSL. The controller 117 can be a control circuit that is electrically coupled between the first and second variable resistors R1 and R2 of the storage circuit 111 and the voltage source supplying the control voltage VC, or the controller 117 can be a device that includes the voltage source supplying the control voltage VC, where it is understood that the coupling configurations of these elements are not limited in this invention.

When the selection voltage VSL is supplied to make the third and fourth transistors M3 and M4 of the selection circuit 113 be conducted so as to lead the storage circuit 111 to be in the volatile storage mode, the controller 117 sets the control voltage VC to have a first voltage value; when the selection voltage VSL is supplied to make the third and fourth transistors M3 and M4 of the selection circuit 113 not to be conducted so as to lead the storage circuit 111 to be in the non-volatile storage mode, the controller 117 sets the control voltage VC to have a second voltage value. The absolute value of the first voltage value is higher than the absolute value of the second voltage value. For example, when the storage circuit 111 operates in the volatile storage mode, the controller 117 can set the control voltage VC to have a voltage value of the working voltage (VDD). When the storage circuit 111 operates in the non-volatile storage mode, the controller 117 can set the control voltage VC to have a voltage value of zero, namely grounding the first and second variable resistors R1 and R2 of the storage circuit 111. On the other hand, when the storage circuit 111 operates in the non-volatile storage mode, the controller 117 can set the control voltage VC to have a voltage value of working voltage (VDD) or other voltage values. In comparison with the embodiment in which the working voltage (VDD) serves as the control voltage VC as the storage circuit 111 operating in the non-volatile storage mode, it may be easier for the embodiment in which the control voltage VC is set to have a voltage value of zero as the storage circuit 111 operating in the non-volatile storage mode to design the waveform of writing signals (the aforementioned resetting signal and setting signal). In other words, in the embodiment in which the control voltage VC is set to zero as the storage circuit 111 operating in the non-volatile storage mode, the waveform design of writing signals is less difficult.

Figure 6:
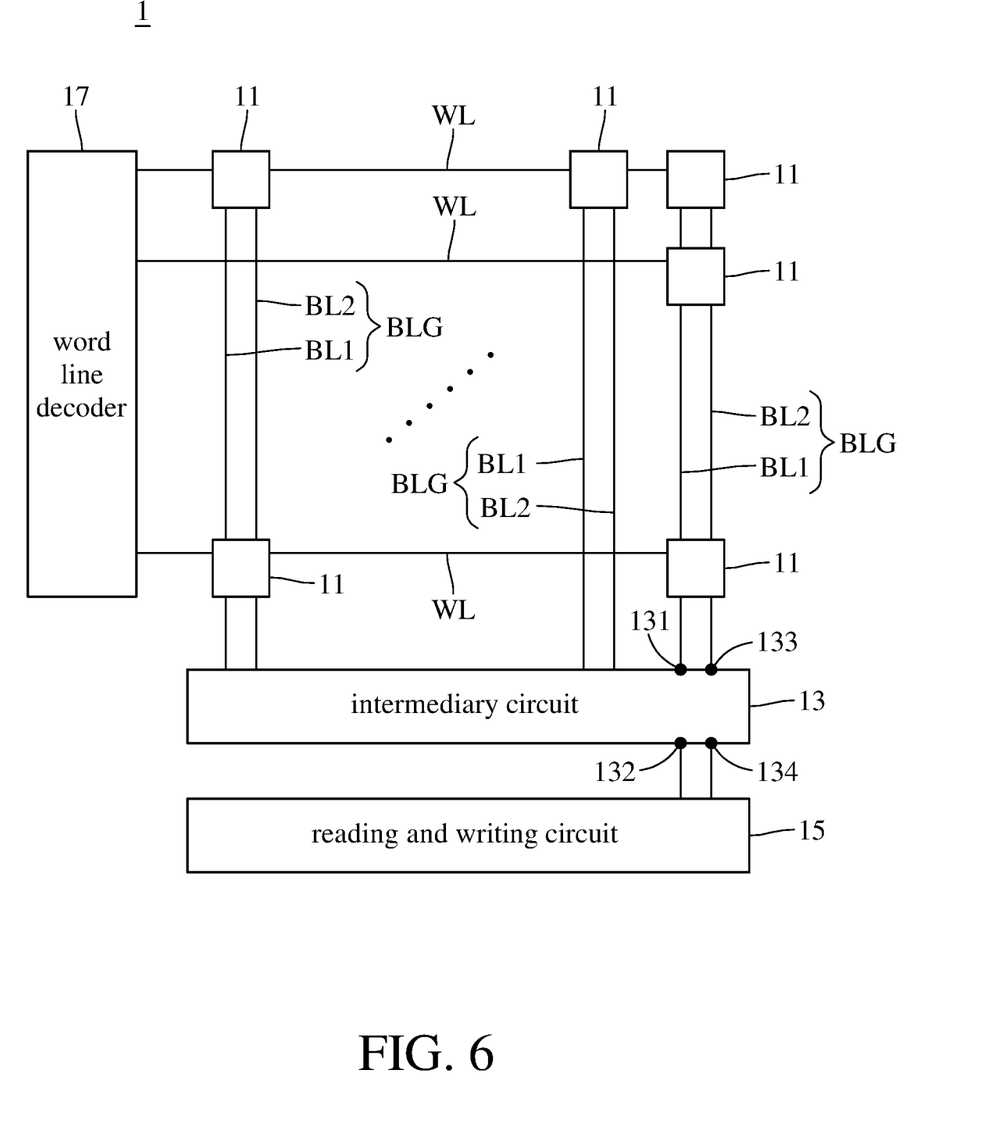
FIG. 6 is a block diagram of a mixed mode memory according to an embodiment of this invention.

This invention also provides a mixed mode memory that comprises an array composed of mixed mode memory cells 11 or composed of mixed mode memory cells 11' as described in the above embodiments. Please refer to FIG. 6 which is a block diagram of a mixed mode memory 1 according to an embodiment of this invention. As shown in FIG. 6, the mixed mode memory 1 comprises a plurality of word lines WL, a plurality of bit line groups BLG, an array composed of a plurality of mixed mode memory cells 11, an intermediary circuit 13, a reading and writing circuit 15 and a word line decoder 17. Each of the mixed mode memory cells 11 is electrically coupled to one of the word lines WL and one of the bit line groups BLG. Each of the bit line groups BLG comprises two bit lines (hereinafter referred to as "first bit line BL1" and "second bit line BL2"). More particularly, the mixed mode memory 1 can comprise m word lines WL, n bit line groups BLG and a memory array composed of mxn mixed mode memory cells 11, wherein m and n are both natural numbers. It should be noted that FIG. 6 exemplarily illustrates that the memory cell array included in the mixed mode memory 1 is composed of the mixed mode memory cells 11 and the mixed mode memory cells 11 are shown as blocks. However, the memory cell array included in the mixed mode memory 1 can also be composed of the mixed mode memory cells 11', or one part of the memory cell array is composed of the mixed mode memory cell 11 and the other part is composed of the mixed mode memory cell 11'. The detailed circuit and operation of the mixed mode memory cell 11 or 11' have been described in the aforementioned embodiments corresponding to FIG. 1 to FIG. 5, and thus are not repeated here.

As described in the preceding embodiments, the mixed mode memory cell 11 operates in the volatile storage mode or the non-volatile storage mode based on the selection voltage. By modulating the setting of the selection voltage of each of the mixed mode memory cells 11 in the mixed mode memory 1, one part of the mixed mode memory cells 11 can be controlled to be in the volatile storage mode, and the other part of the mixed mode memory cells 11 can be controlled to be in the non-volatile storage mode. Therefore, the mixed mode memory 1 can match a variety of computing devices or other electronic devices with different requirements for the storage mode without changing the circuit design of the memory, so that the development cost is reduced.

Please refer to FIG. 6. As shown in FIG. 6, the word line WL is electrically coupled to the word line decoder 17. The word line WL is configured to transmit a control signal from the word line decoder 17 so as to control whether the coupled mixed mode memory cells 11 can perform read/write operation. The first bit line BL1 and the second bit line BL2 in the bit line group BLG are electrically coupled to the intermediary circuit 13, and the intermediary circuit 13 is electrically coupled to the reading and writing circuit 15. Accordingly, the first bit line BL1 and the second bit line BL2 in the bit line group BLG can receive two writing signals from the reading and writing circuit 15 through the intermediary circuit 13, or transmit reading response signals, which are generated by the mixed mode memory cell 11 according to the reading drive signal, to the reading and writing circuit 15 through the intermediary circuit 13. In other words, the intermediary circuit 13 serves as a medium for transmitting the writing signals from the reading and writing circuit 15 to the bit line group BLG, or for transmitting the reading response signals from the bit line group BLG to the reading and writing circuit 15.

The intermediary circuit 13 comprises a bit line decoder. The function and operation of the bit line decoder are well-known to a person having ordinary skill in the art, and are not described in detail here. Moreover, the intermediary circuit 13 can further comprise a modulator disposed between the bit line group BLG and the bit line decoder. The modulator is configured to modulate the writing signals from the reading and writing circuit 15 and then transmit the modulated writing signals to the bit line group BLG, or to modulate the reading response signals from the bit line group BLG and then transmit the modulated reading response signals to the reading and writing circuit 15. The coupling relationship between the intermediary circuit 13 and the reading and writing circuit 15 is further described as below. As shown in FIG. 6, the intermediary circuit 13 comprises the first terminal 131 and the second terminal 132 which correspond to each other, and comprises the third terminal 133 and the fourth terminal 134 which correspond to each other. The first terminal 131 is electrically coupled to the first bit line BL1, the third terminal 133 is electrically coupled to the second bit line BL2, and the second terminal 132 and the fourth terminal 134 are electrically coupled to the reading and writing circuit 15. It should be noted that FIG. 6 exemplarily illustrates that the second terminal 132 and the fourth terminal 134 of the intermediary circuit 13 are both electrically coupled to the reading and writing circuit 15, but in another embodiment, the intermediary circuit 13 can be electrically coupled to the reading and writing circuit 15 through merely one of the second terminal 132 and the fourth terminal 134.

The above mentioned corresponding relationship between the first terminal 131 and the second terminal 132 of the intermediary circuit 13 shows that the signal output from the second terminal 132 is associated with the signal received by the first terminal 131, and the signal received by the second terminal 132 is associated with the signal output from the first terminal 131. For example, if the first terminal 131 of the intermediary circuit 13 receives a reading response signal from the first bit line BL1, the second terminal 132 of the intermediary circuit 13 transmits the reading response signal that passes through the intermediary circuit 13 (the reading response signal to be transmitted is already modulated if the intermediary circuit 13 comprises the modulator) to the reading and writing circuit 15; if the second terminal 132 of the intermediary circuit 13 receives a writing signal from the reading and writing circuit 15, the first terminal 131 of the intermediary circuit 13 transmits the writing signal that passes through the intermediary circuit 13 (the writing signal to be transmitted is already modulated if the intermediary circuit 13 comprises the modulator) to the first bit line BL1. The corresponding relationship between the third terminal 133 and the fourth terminal 134 is the same, and thus is not repeated.

The reading and writing circuit 15 has a writing mode and a reading mode, and can switch between the writing mode and the reading mode according to an external instruction or a preset instruction. In the writing mode, the reading and writing circuit 15 can generate writing signals according to an external instruction (e.g., user-entered instruction) or receive writing signals from the outside, and then the reading and writing circuit 15 can transmit the writing signals to the first bit line BL1 and the second bit line BL2 through the intermediary circuit 13 so that the mixed mode memory cell 11 can store one bit or two bits according to the writing signals. The storage method has been described in detail in the preceding embodiments, and thus is not repeated here. In contrast, in the reading mode, the reading and writing circuit 15 can apply a constant voltage (i.e., reading drive signal) to the first and second bit lines BL1 and BL2 through the intermediary circuit 13 and obtain the current values (i.e., reading response signals) of the two lines through the intermediary circuit 13, or apply a constant current (i.e., reading drive signal) to the first and second bit lines BL1 and BL2 through the intermediary circuit 13 and obtain the voltage values (i.e., reading response signals) of the two lines through the intermediary circuit 13, so as to determine the one or two bits stored in the mixed mode memory cell 11.

As mentioned above, when the mixed mode memory cell 11 operates in the non-volatile storage mode, one or two bits can be written into the mixed mode memory cell 11. Correspondingly, the reading mode of the reading and writing circuit 15 can include a single-bit determining mode and a dual-bit determining mode. In the single-bit determining mode, the reading and writing circuit 15 determines the stored one bit according to the two reading response signals it obtains; in the dual-bit determining mode, the reading and writing circuit 15 determines the stored two bits according to the two reading response signals it obtains and a reference signal. In the implementation of applying a constant voltage to the bit lines and obtaining the current values of the bit lines, assuming that the first or second variable resistors R1 or R2 will have a first current value if it has a relatively high resistance and it is applied with the constant voltage, and assuming that the first or second variable resistors R1 or R2 will have a second current value as if it has a relatively low resistance and it is applied with the constant voltage, the current value of the reference signal is set in the range between the first current value and the second current value. In the implementation of applying a constant current to the bit lines and obtaining the voltage values of the bit lines, assuming that the first or second variable resistors R1 or R2 will have a first voltage value if it has a relatively high resistance and it is applied with the constant current, and assuming that the first or second variable resistors R1 or R2 will have a second voltage value if it has a relatively low resistance and it is applied with the constant current, the voltage value of the reference signal is set in the range between the first voltage value and the second voltage value.

The reading and writing circuit 15 can comprise a processor, a writing circuit and a reading circuit, wherein the processor is electrically coupled to the writing circuit and the reading circuit. The processor is, for example, a central processing unit, a microcontroller, a programmable logic controller, etc. The processor can enable the writing circuit or the reading circuit to operate according to an external instruction (e.g., user-entered instruction) or an internally preset instruction. The writing circuit is configured to perform the aforementioned writing mode. Its detailed circuit design can be achieved by a person having ordinary skill in the art according to the requirements, and thus is not described in detail here. As for the reading circuit, this invention provides a specific circuit design to perform the aforementioned single-bit determining mode or dual-bit determining mode.

Figure 7:
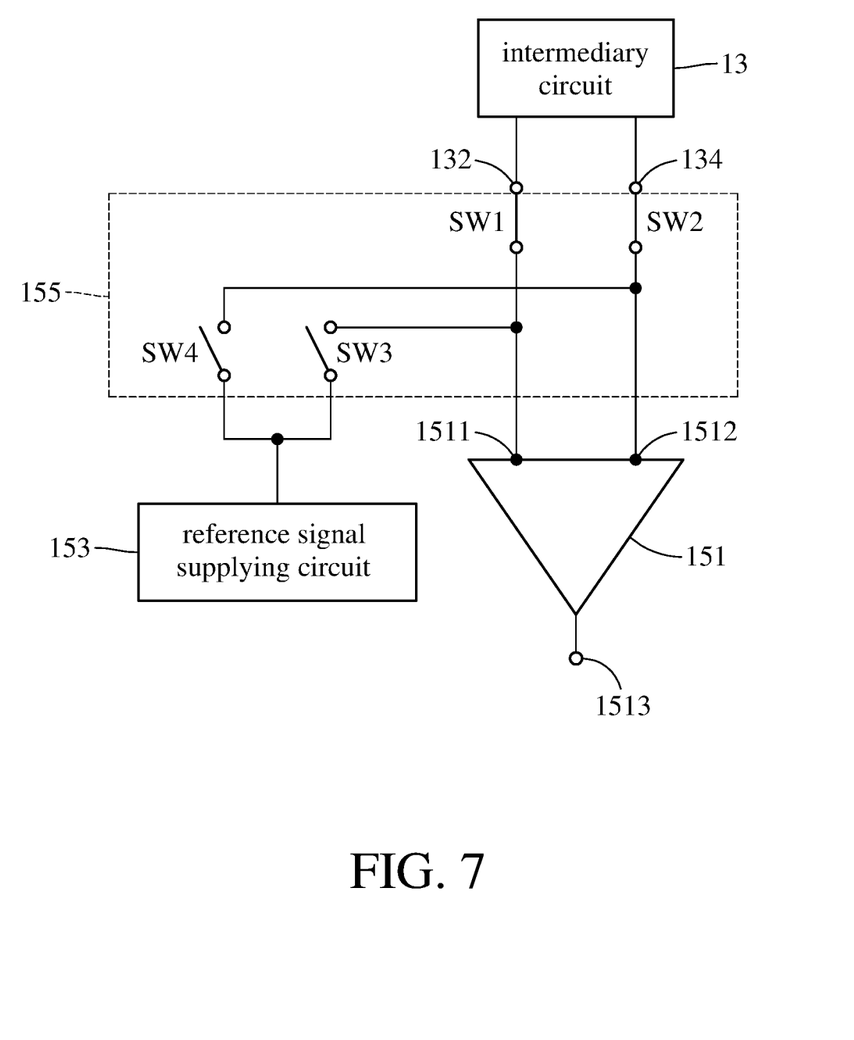
FIG. 7 is a schematic circuit diagram of a part of a mixed mode memory according to an embodiment of this invention.

Please refer to FIG. 1, FIG. 6 and FIG. 7, wherein FIG. 7 is a schematic circuit diagram of a part of a mixed mode memory according to an embodiment of this invention. FIG. 7 exemplarily illustrates the circuit design of the reading circuit of the reading and writing circuit 15 in FIG. 6, and the coupling relationship between the reading circuit and the intermediate circuit 13. As shown in FIG. 7, the reading and writing circuit 15 comprises a comparator 151, a reference signal supplying circuit 153 and a control circuit 155, wherein the control circuit 155 is disposed among the comparator 151, the reference signal supplying circuit 153 and the intermediary circuit 13. The comparator 151 has the first input terminal 1511, the second input terminal 1512 and an output terminal 1513. The comparator 151 comprises a sense amplifier (SA), for example, and is configured to compare the signals respectively received by the first input terminal 1511 and the second input terminal 1512, generate a comparison result and output it. The electrical coupling relationship between the first input terminal 1511 of the comparator 151 and other circuits and the electrical coupling relationship between the second input terminal 1512 of the comparator 151 and other circuits are controlled by the control circuit 155, and the control method will be described in detail later. The output terminal 1513 of the comparator 151 can be coupled to a memory to store the comparison result, or coupled to a user interface to show the comparison result, or coupled to the aforementioned processor of the reading and writing circuit 15 to further process the comparison result, where it is understood that the coupling configuration of the output terminal 1513 of the comparator 151 is not limited in this invention. The reference signal supplying circuit 153 can comprise a current source to supply a reference current, or comprise a voltage source to supply a reference voltage.

The control circuit 155 is configured to control the electrical coupling status of the first input terminal 1511 and the second input terminal 1512 of the comparator 151. In the single-bit determining mode, the control circuit 155 controls the first input terminal 1511 and the second input terminal 1512 of the comparator 151 to respectively obtain two reading response signals which pass through the intermediary circuit 13. In the dual-bit determining mode, the control circuit 155 controls the first input terminal 1511 of the comparator 151 to obtain one of the two reading response signals which pass through the intermediary circuit 13 and controls the second input terminal 1512 of the comparator 151 to obtain the reference signal, or controls the first input terminal 1511 of the comparator 151 to obtain the reference signal and controls the second input terminal 1512 of the comparator 151 to obtain the other one of the two reading response signals which pass through the intermediary circuit.

More particularly, the control circuit 155 can comprise a first switch SW1, a second switch SW2, a third switch SW3 and a fourth switch SW4. The first switch SW1 is disposed between the second terminal 132 of the intermediary circuit 13 and the first input terminal 1511 of the comparator 151, and configured to conduct or not conduct the electrical path between the second terminal 132 of the intermediary circuit 13 and the first input terminal 1511 of the comparator 151; the second switch SW2 is disposed between the fourth terminal 134 of the intermediary circuit 13 and the second input terminal 1512 of the comparator 151, and configured to conduct or not conduct the electrical path between the fourth terminal 134 of the intermediary circuit 13 and the second input terminal 1512 of the comparator 151; the third switch SW3 is disposed between the reference signal supplying circuit 153 and the first input terminal 1511 of the comparator 151, and configured to conduct or not conduct the electrical path between the reference signal supplying circuit 153 and the first input terminal 1511 of the comparator 151; the fourth switch SW4 is disposed between the reference signal supplying circuit 153 and the second input terminal 1512 of the comparator 151, and configured to conduct or not conduct the electrical path between the reference signal supplying circuit 153 and the second input terminal 1512 of the comparator 151.

In the single-bit determining mode, the first switch SW1 and the second switch SW2 are conducted, and the third switch SW3 and the fourth switch SW4 are not conducted. The first input terminal 1511 of the comparator 151 obtains the reading response signal corresponding to the first variable resistor R1 of the mixed mode memory cell 11 from the first bit line BL1 through the second terminal 132 of the intermediary circuit 13, and the second input terminal 1512 of the comparator 151 obtains the reading response signal corresponding to the second variable resistor R2 of the mixed mode memory cell 11 from the second bit line BL2 through the fourth terminal 134 of the intermediary circuit 13. The comparator 151 can compare the current values or voltage values of the two reading response signals, and output the comparison result that corresponds to the bit stored in the first and second variable resistors R1 and R2 of the mixed mode memory cell 11.

The dual-bit determining mode can respectively determine the bit stored in the first variable resistor R1 and the bit stored in the second variable resistor R2. In the procedure of determining the bit stored in the first variable resistor R1, the first switch SW1 and the fourth switch SW4 are conducted, and the second switch SW2 and the third switch SW3 are not conducted, so the first input terminal 1511 of the comparator 151 obtains the reading response signal from the first bit line BL1 through the second terminal 132 of the intermediary circuit 13, and the second input terminal 1512 of the comparator 151 obtains the reference signal from the reference signal supplying circuit 153. The comparator 151 compares the current values or voltage values of the obtained reading response signal and the reference signal, and outputs the comparison result that corresponds to the bit stored in the first variable resistor R1 of the mixed mode memory cell 11. In the procedure of determining the bit stored in the second variable resistor R2, the first switch SW1 and the fourth switch SW4 are not conducted, and the second switch SW2 and the third switch SW3 are conducted, so the first input terminal 1511 of the comparator 151 obtains the reference signal from the reference signal supplying circuit 153, and the second input terminal 1512 of the comparator 151 obtains the reading response signal from the second bit line BL2 through the second terminal 132 of the intermediary circuit 13. The comparator 151 compares the current values or voltage values of the obtained reading response signal and the reference signal, and outputs the comparison result that corresponds to the bit stored in the second variable resistor R2 of the mixed mode memory cell 11.

Figure 8:
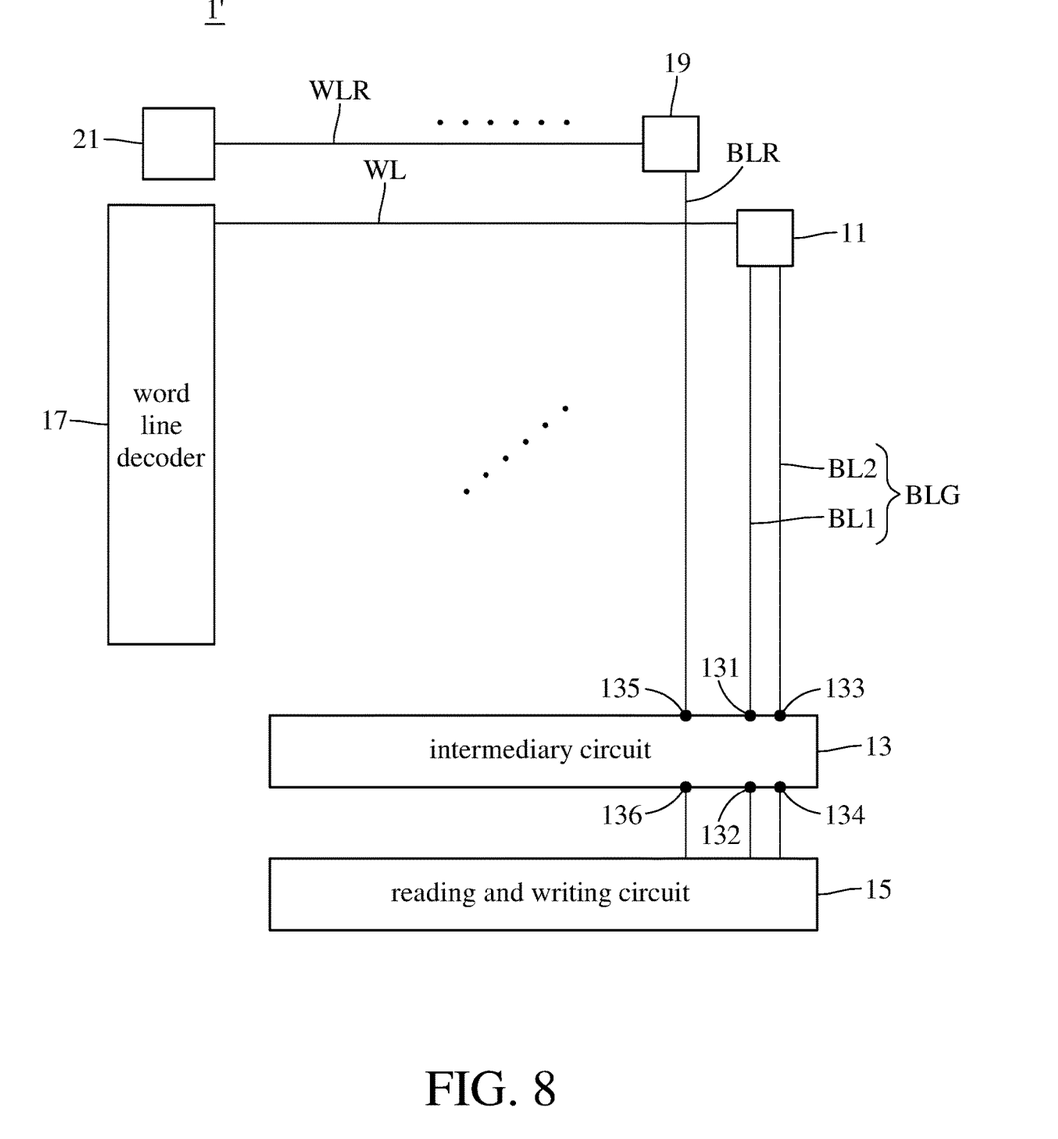
FIG. 8 is a block diagram of a mixed mode memory according to another embodiment of this invention.

In the above embodiment, the reference signal supplying circuit 153 of the reading and writing circuit 15 of the mixed mode memory 1 is implemented by a current source or a voltage source, and the reference signal supplied by it has a fixed current value or a fixed voltage value. This invention also provides a mixed mode memory whose reference signal supplying circuit can be coupled to a variable resistor, and the current value or voltage value of the reference signal supplied by this reference signal supplying circuit can be changed with the resistance change of the variable resistor. More particularly, please refer to FIG. 6, FIG. 7 and FIG. 8, wherein FIG. 8 is a block diagram of a mixed mode memory 1' according to another embodiment of this invention. The mixed mode memory 1' shown in FIG. 8 is substantially the same as the mixed mode memory 1 shown in FIG. 6. It should be noted that, in order to facilitate the presentation of the additional components of the mixed mode memory 1' in comparison with the mixed mode memory 1, FIG. 8 merely illustrates a single word line WL, a single-bit line group BLG and a single mixed mode memory cell 11. However, in fact, the mixed mode memory 1' comprises a plurality of word lines WL, a plurality of bit line groups BLG, an array composed of a plurality of mixed mode memory cells 11, an intermediary circuit 13, a reading and writing circuit 15 and a word line decoder 17. Each of the mixed mode memory cells 11 is electrically coupled to one of the word lines WL and one of the bit line groups BLG. Each of the bit line groups BLG comprises the first bit line BL1 and the second bit line BL2. More particularly, the mixed mode memory 1' can comprise m word lines WL, n bit line groups BLG and a memory array composed of mxn mixed mode memory cells 11, wherein m and n are both natural numbers. The functions and operations of the word line WL, the mixed mode memory cells 11, the intermediary circuit 13, the reading and writing circuit 15 and the word line decoder 17, and their coupling relationship are all the same as those of the mixed mode memory 1 described in the preceding embodiments, and thus are not repeated here.

In comparison with the mixed mode memory 1 in FIG. 6, the mixed mode memory 1' in FIG. 8 further comprises a reference word line WLR, a plurality of reference bit lines BLR, a plurality of reference units 19 and a reference word line decoder 21. It should be noted that, for ease of describing the operation, FIG. 8 merely illustrates a single reference unit 19 and a single reference bit line BLR; however, in fact, the number of the reference units 19 and the number of the reference bit lines BLR can be the same as the number of the mixed mode memory cells 11 in one column, and the reference units 19 are lined up as a column near to columns of the mixed mode memory cells 11 in the memory array. Taking a memory array composed of mxn mixed mode memory cells as an example, the number of the reference units 19 is n, and the number of the reference bit lines BLR is n. As shown in FIG. 8, the reference unit 19 is electrically coupled to the word line decoder 21 through the reference word line WLR, and electrically coupled to the intermediary circuit 13 through the reference bit line BLR. The reference word line WLR is configured to transmit a control signal from the reference word line decoder 21 so as to control the reference unit 19 to operate or not to operate. The operation of the reference unit 19 will be described later.

In addition to the first terminal to fourth terminal 131-134 as descried in the foregoing embodiment, the intermediary circuit 13 of the mixed mode memory 1' further includes the fifth terminal 135 and the sixth terminal 136 which correspond to each other. The corresponding relationship between the fifth terminal 135 and the sixth terminal 136 is the same as that between the first terminal 131 and the second terminal 132 as mentioned above, and thus is not repeated here. The fifth terminal 135 of the intermediary circuit 13 is electrically coupled to the reference unit 19 through the reference bit line BLR, and the sixth terminal 136 is electrically coupled to the reading and writing circuit 15. The reading and writing circuit 15 of the mixed mode memory 1' is similar to the reading and writing circuit 15 of the mixed mode memory 1, and includes the circuit elements as shown in FIG. 7. The operations of the comparator 151 and the control circuit 155 have been described in the foregoing embodiments, and thus are not repeated here. The difference between the reading and writing circuit 15 of the mixed mode memory 1' and the reading and writing circuit 15 of the mixed mode memory 1 lies in that the reference signal supplying circuit 153 of reading and writing circuit 15 of the mixed mode memory 1' is electrically coupled to the sixth terminal 136 of the intermediary circuit 13 so as to obtain the reference signal from the reference unit 19 through the intermediary circuit 13.

Figure 9:
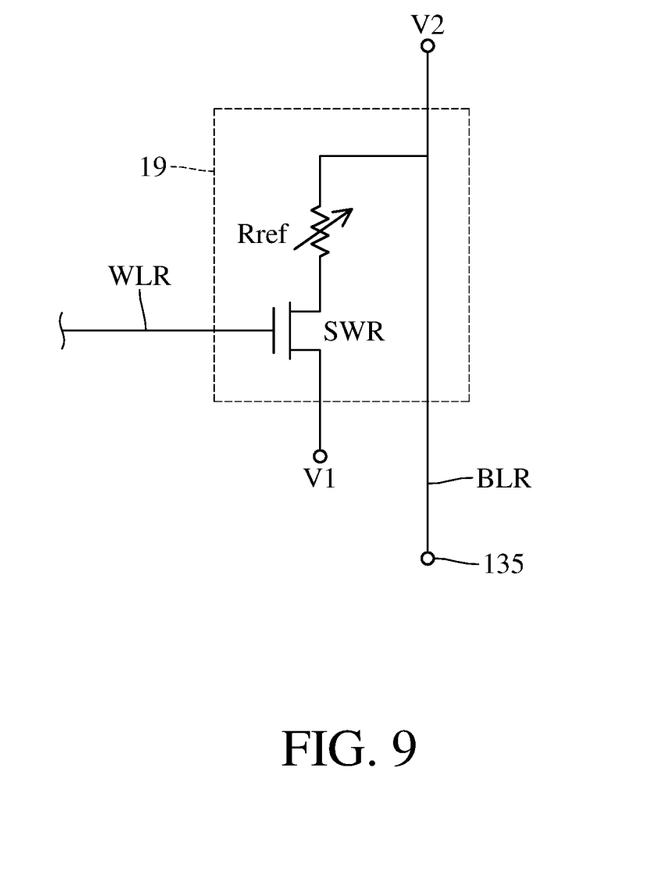
FIG. 9 is a schematic circuit diagram of a reference unit of a mixed mode memory according to another embodiment of this invention.

More particularly, please refer to FIG. 8 and FIG. 9, wherein FIG. 9 is a schematic circuit diagram of a reference unit of a mixed mode memory according to another embodiment of this invention. As shown in the figures, the reference unit 19 comprises a reference switch component SWR (e.g., transistor) and a reference variable resistor Rref which are electrically coupled to each other. The reference switch component SWR includes a first terminal, a second terminal and a control terminal, wherein the first terminal is electrically coupled to one terminal of the reference variable resistor Rref, the second terminal is configured to receive the first voltage V1, and the control terminal is electrically coupled to the reference word line WLR and controlled by it so as to make the electrical path between the first terminal and the second terminal being conducted or not conducted. The other terminal of the reference variable resistor Rref is configured to receive the second voltage V2. When the reference switch component SWR is conducted and a voltage difference exists between the first voltage V1 and the second voltage V2, the reference signal supplying circuit 153 of the reading and writing circuit 15 of the mixed mode memory 1' can obtain, through the intermediary circuit 13 and the reference bit line BLR, the current passing through the reference variable resistor Rref or the voltage across the reference variable resistor Rref, and set this current or voltage as reference signal. More specifically, the reference variable resistor Rref is the same as the first variable resistor R1 and the second variable resistor R2 in the mixed mode memory cell 11, and can comprise a phase change element or a resistance change element. In the process of manufacturing, the variable resistor in the reference unit 19 can be formed at the same time while the variable resistors in the mixed mode memory cell 11 is formed. Therefore, in comparison with the embodiment where the reference signal has to be designed in advance to have a fixed current value or a fixed voltage value, the present embodiment avoids the problem that the property (e.g., resistance) of the reference variable resistor may easily vary during the manufacturing process thereof.

In view of the above, the mixed mode memory provided in this invention comprises an array composed of a number of mixed mode memory cells each of which can be set to operate in a volatile storage mode or a non-volatile storage mode according to requirements, so the mixed mode memory, thus having high adaptability. By adjusting the selection voltage corresponding to each memory cell in the memory, the mixed mode memory provided in this invention may match a variety of computing devices or other electronic devices with different requirements for a specific storage mode without changing the circuit design of the memory; therefore, the development cost is reduced.

What is claimed is:

1. A mixed mode memory, comprising:
   a memory array comprising a plurality of mixed mode memory cells;
   a word line decoder electrically coupled to the memory array;
   an intermediary circuit electrically coupled to the memory array; and
   a reading and writing circuit electrically coupled to the intermediary circuit;
   wherein each of the plurality of mixed mode memory cells comprising:
   a reading and writing component group electrically coupled to a word line and two bit lines, wherein the word line controls the reading and writing component group to be conducted or not conducted, and the two bit lines respectively transmit two data signals;
   a storage circuit configured to generate two reading response signals based on a reading drive signal; and
   a selection circuit electrically coupled to the storage circuit, and configured to control the storage circuit to operate in a volatile storage mode or a non-volatile storage mode based on a selection voltage.

2. The mixed mode memory according to claim 1, wherein the storage circuit comprises a first variable resistor, a second variable resistor, a first transistor and a second transistor; wherein when the reading and writing component group transmits the two data signals to the storage circuit and the storage circuit operates in the non-volatile storage mode, the first variable resistor and the second variable resistor selectively changes resistances respectively based on the two data signals; wherein the selection circuit is configured to control electrical coupling status among the first variable resistor, the second variable resistor, the first transistor and the second transistor based on the selection voltage; wherein when the selection circuit controls the electrical coupling status to be conducted based on the selection voltage, the storage circuit operates in the volatile storage mode, and when the selection circuit controls the electrical coupling status not to be conducted based on the selection voltage, the storage circuit operates in the non-volatile storage mode.

3. The mixed mode memory according to claim 2, wherein each of the first and second variable resistors comprises a phase change element or a resistance change element.

4. The mixed mode memory according to claim 2, wherein the reading and writing circuit comprises:
   a comparator having two input terminals, and configured to compare signals received by the two input terminals and output a comparison result;
   a reference signal supplying circuit configured to supply a reference signal; and
   a control circuit configured to control electrical coupling status of the two input terminals of the comparator;
   wherein in a dual-bit determining mode, the control circuit controls one of the two input terminals of the comparator to obtain one of the two reading response signals which pass through the intermediary circuit, and controls the other one of the two input terminals of the comparator to obtain the reference signal; in a single-bit determining mode, the control circuit controls the two input terminals of the comparator to respectively obtain the two reading response signals which pass through the intermediary circuit.

5. The mixed mode memory according to claim 4, wherein the reference signal supplying circuit comprises a plurality of reference units which are lined up in the memory array, wherein each of the plurality of reference units comprises a reference switch component and a reference variable resistor, and the reference variable resistor is electrically coupled to the reference switch component.

6. The mixed mode memory according to claim 5, wherein the reference variable resistor comprises a phase change element or a resistance change element, and the reference signal supplying circuit is configured to obtain the reference signal associated with the reference variable resistor.

7. The mixed mode memory according to claim 2, wherein the selection circuit comprises:
   a third transistor, wherein a first terminal of the third transistor is electrically coupled to one terminal of the first variable resistor, a control terminal of the second transistor and the reading and writing component group, a second terminal of the third transistor is electrically coupled to a first terminal of the first transistor, and a control terminal of the third transistor is configured to receive the selection voltage; and
   a fourth transistor, wherein a first terminal of the fourth transistor is electrically coupled to one terminal of the second variable resistor, a control terminal of the first transistor and the reading and writing component group, a second terminal of the fourth transistor is electrically coupled to a first terminal of the second transistor, and a control terminal of the fourth transistor is configured to receive the selection voltage.

8. The mixed mode memory according to claim 7, wherein the reading and writing component group comprises:
   a fifth transistor fifth transistor, wherein a first terminal of the fifth transistor is electrically coupled to the first terminal of the third transistor, a second terminal of the fifth transistor is electrically coupled to one of the two bit lines, and a control terminal of the fifth transistor is electrically coupled to the word line; and
   a sixth transistor, wherein a first terminal of the sixth transistor is electrically coupled to the first terminal of the fourth transistor, a second terminal of the sixth transistor is electrically coupled to the other one of the two bit lines, and a control terminal of the sixth transistor is electrically coupled to the word line.

9. The mixed mode memory according to claim 8, wherein one end of the first and second variable resistors is electrically coupled to the reading and writing component group, and the other end of the first and second variable resistors is configured to receive a control voltage.

10. The mixed mode memory according to claim 9, wherein the mixed mode memory cell further comprises a controller, and the controller is electrically coupled to the storage circuit and the selection circuit, and configured to detect the selection voltage and to control the control voltage based on the selection voltage.

\* \* \* \* \*